United States Patent
Lee et al.

(10) Patent No.: US 8,692,372 B2
(45) Date of Patent: Apr. 8, 2014

(54) SEMICONDUCTOR DEVICE HAVING IMPURITY DOPED POLYCRYSTALLINE LAYER INCLUDING IMPURITY DIFFUSION PREVENTION LAYER AND DYNAMIC RANDOM MEMORY DEVICE INCLUDING THE SEMICONDUCTOR DEVICE

(75) Inventors: Dong-kak Lee, Seoul (KR); Sung-gil Kim, Seoul (KR); Soo-jin Hong, Guri-si (KR); Sun-ghil Lee, Yongin-si (KR); Deok-hyung Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 362 days.

(21) Appl. No.: 12/728,396

(22) Filed: Mar. 22, 2010

(65) Prior Publication Data

US 2011/0049596 A1    Mar. 3, 2011

(30) Foreign Application Priority Data

Aug. 28, 2009 (KR) .................. 10-2009-0080692

(51) Int. Cl.
*H01L 27/108* (2006.01)
*H01L 23/48* (2006.01)
*H01L 29/78* (2006.01)

(52) U.S. Cl.
USPC .......... 257/751; 257/734; 257/741; 257/750; 257/E27.084

(58) Field of Classification Search
USPC .................. 257/251, 296, E21.649; 438/643
See application file for complete search history.

(56) References Cited

U.S. PATENT DOCUMENTS

| | | | | |
|---|---|---|---|---|
| 6,380,055 | B2* | 4/2002 | Gardner et al. | 438/585 |
| 7,153,745 | B2* | 12/2006 | Cho et al. | 438/270 |
| 2002/0030281 | A1* | 3/2002 | Jung | 257/774 |
| 2002/0113237 | A1* | 8/2002 | Kitamura | 257/71 |
| 2002/0173094 | A1* | 11/2002 | Park et al. | 438/241 |
| 2004/0002185 | A1* | 1/2004 | Takahashi | 438/224 |

FOREIGN PATENT DOCUMENTS

| | | |
|---|---|---|
| JP | 08-264774 | 10/1996 |
| JP | 2004-031691 | 1/2004 |
| KR | 1020050028598 A | 3/2005 |

* cited by examiner

*Primary Examiner* — Colleen Matthews
*Assistant Examiner* — William Harriston
(74) *Attorney, Agent, or Firm* — Myers Bigel Sibley & Sajovec, PA

(57) ABSTRACT

Provided are semiconductor devices including a semiconductor substrate, an insulating layer including a contact hole through which the semiconductor substrate is exposed, and a polysilicon layer filling the contact hole. The polysilicon layer is doped with impurities and includes an impurity-diffusion prevention layer. In the semiconductor devices, the impurities included in the polysilicon layer do not diffuse into the insulating layer and the semiconductor substrate due to the impurity-diffusion prevention layers.

6 Claims, 9 Drawing Sheets

SEMICONDUCTOR DEVICE HAVING IMPURITY DOPED POLYCRYSTALLINE LAYER INCLUDING IMPURITY DIFFUSION PREVENTION LAYER AND DYNAMIC RANDOM MEMORY DEVICE INCLUDING THE SEMICONDUCTOR DEVICE

CROSS-REFERENCE TO RELATED APPLICATIONS

This application claims the benefit of Korean Patent Application No. 10-2009-0080692, filed on Aug. 28, 2009, in the Korean Intellectual Property Office, the disclosure of which is hereby incorporated herein by reference as if set forth fully herein.

BACKGROUND

Embodiments of the present invention relate to semiconductor devices and dynamic random access memory (DRAM) devices including the semiconductor devices, and more particularly, to semiconductor devices having a polysilicon layer and DRAM devices including the semiconductor devices.

Along with the increase of the integration density of semiconductor devices, that is, integration circuit (IC) semiconductor devices, the size and channel length of semiconductor devices have decreased. However, when the size of a semiconductor device decreases, the electrical properties of the semiconductor device may deteriorate.

For example, a semiconductor device may include a polysilicon layer doped with impurities, for example, arsenic (As) or phosphorus (P), as an element constituting a conductive layer. When As or P diffuses through the semiconductor device during the manufacture of the semiconductor device, the electrical properties of the semiconductor device may deteriorate.

SUMMARY

Some embodiments of the present invention include semiconductor devices preventing diffusion of impurities doped in a polysilicon layer. Devices may include a semiconductor substrate and an insulating layer that includes a contact hole through which the semiconductor substrate is exposed. A polysilicon layer may be provided that is configured to fill and cover the contact hole. In some embodiments, the polysilicon layer includes impurities that are used to dope the polysilicon layer and an impurity-diffusion prevention layer that is configured to prevent impurities included in the polysilicon layer from diffusing into the insulating layer and into the semiconductor substrate.

In some embodiments, the impurity-diffusion prevention layer is formed in the polysilicon layer. Some embodiments provide that the impurity-diffusion prevention layer is formed at an interface between the semiconductor substrate and the polysilicon layer. Some other embodiments provide that the impurity-diffusion prevention layer is formed at an interface between the insulating layer and the polysilicon layer. In some embodiments, the impurity-diffusion prevention layer includes at least one material selected from a group including carbon, nitrogen and oxygen.

Some embodiments of the present invention include semiconductor devices including multiple gate stacks formed on a semiconductor substrate and a impurity region formed in the semiconductor substrate between the plurality of gate stacks. A pad polysilicon layer may be formed on the impurity region between the gate stacks. The pad polysilicon layer is doped with impurities and includes an impurity-diffusion prevention layer that is configured to prevent the diffusion of the impurities in the pad polysilicon layer into the impurity region, the semiconductor substrate or the gate stacks.

Some embodiments provide that each of the gate stacks includes a gate insulating layer, a gate electrode and a gate cap layer. The gate insulating layer may be formed in a recess channel trench formed by etching the semiconductor substrate. The gate electrode may be formed on a portion of the gate insulating layer, which is formed in the recess channel trench, and the semiconductor device.

In some embodiments, the impurity-diffusion prevention layer includes at least one material selected from a group including carbon, nitrogen and oxygen. Some embodiments provide that the impurity-diffusion prevention layer is formed in the pad polysilicon layer, at an interface between the impurity region and the pad polysilicon layer. In some embodiments, the impurity-diffusion prevention layer is formed at an interface between the gate stack and the pad polysilicon layer.

Some embodiments of the present invention include a dynamic random access memory (DRAM) semiconductor device that includes multiple gate stacks formed on a semiconductor substrate, and functioning as word lines. An impurity region may be formed in the semiconductor substrate between the gate stacks. A direct contact (DC) pad and a buried contact (BC) pad may be formed on the impurity region between the gate stacks, such that each of the DC pad and the BC pad includes a polysilicon layer that is doped with impurities and that includes an impurity-diffusion prevention layer that is configured to prevent diffusion of the impurities in the DC pad and the BC pad into the impurity region. The device may include a bit line and a capacitor that are connected to the DC pad and the BC pad, respectively.

In some embodiments, the impurity-diffusion prevention layer is formed in the DC pad and the BC pad, at an interface between the impurity region and each of the DC pad and the BC pad. Some embodiments provide that the impurity-diffusion prevention layer is formed in the DC pad and the BC pad, at an interface between the gate stack and each of the DC pad and the BC pad.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

DETAILED DESCRIPTION OF THE EMBODIMENTS

Figure 1:
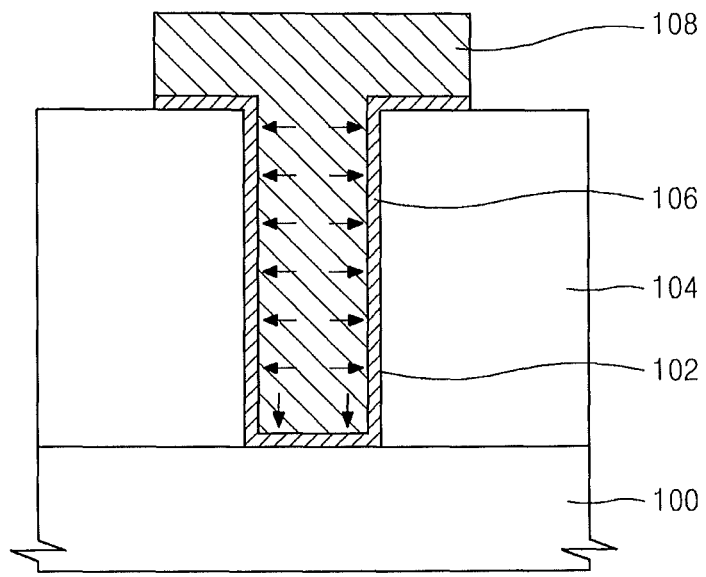
FIGS. 1 and 2 are cross-sectional views of a semiconductor device according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventions is provided.

Reference numerals are indicated in detail in some embodiments of the present invention, and their examples are represented in reference drawings. Throughout the drawings, like reference numerals are used for referring to the same or similar elements in the description and drawings.

A semiconductor device includes a polysilicon layer doped with impurities, for example, arsenic (As) or phosphorus (P), as an element constituting a conductive layer. The electrical properties of a semiconductor device may deteriorate when the impurities, for example, As or P, diffuse through the semiconductor device during the manufacture of the semiconductor device.

In particular, leakage and refresh properties deteriorate when impurities included in the polysilicon layer used as a pad of a dynamic random access memory (DRAM) device of the semiconductor device diffuse to the outside.

Thus, in order to prevent diffusion of impurities doped in the polysilicon layer, some embodiments of the present invention include a polysilicon layer doped with impurities that includes an impurity-diffusion prevention layer. Some embodiments provide that the impurity-diffusion prevention layer may be uniformly formed in the polysilicon layer. In some embodiments, diffusion prevention impurities may be non-uniformly doped and/or distributed in the impurity-diffusion prevention layer.

The polysilicon layer doped with the impurities that includes the impurity-diffusion prevention layer may be used in a semiconductor device, such as, for example, a DRAM device.

Figure 2:
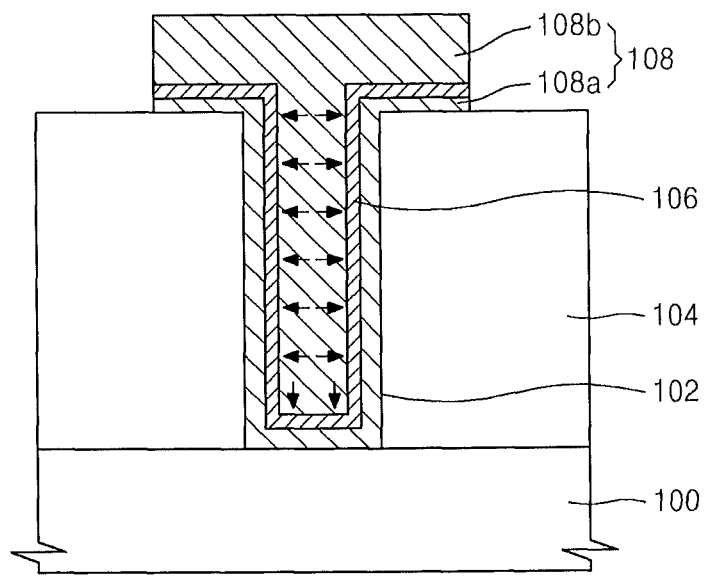

Reference is now made to FIGS. 1 and 2, which are cross-sectional views of a semiconductor device according to some embodiments of the present invention. In detail, FIGS. 1 and 2 are conceptual views of a semiconductor device, for explaining a polysilicon layer 108 doped with impurities and including an impurity-diffusion prevention layer 106. Some embodiments provide that an insulating layer 104 is formed on a semiconductor substrate 100, for example, a silicon substrate. A contact hole 102 through which the semiconductor substrate 100 is exposed may be formed in the insulating layer 104. That is, the insulating layer 104 may include the contact hole 102 through which the semiconductor substrate 100 is exposed. In some embodiments, the polysilicon layer 108 fills and covers the contact hole 102, is doped with impurities, and includes the impurity-diffusion prevention layer 106. The impurities doped in the polysilicon layer 108 may include As and/or P, among others. The impurity-diffusion prevention layer 106 may include a material layer including carbon, nitrogen and/or oxygen, among others. Thus, the impurities doped in the polysilicon layer 108 and the impurities contained the impurity-diffusion prevention layer 106 may be different.

In FIG. 1, the impurity-diffusion prevention layer 106 may be formed at an interface between the semiconductor substrate 100 and the polysilicon layer 108, and at an interface between the insulating layer 104 and the polysilicon layer 108. Although not illustrated in FIG. 1, some embodiments provide that the impurity-diffusion prevention layer 106 may be non-uniformly formed by doping the polysilicon layer 108 with diffusion-prevention impurities, for example, carbon, nitrogen and/or oxygen, among others. Impurities included in the polysilicon layer 108 do not diffuse into the insulating layer 104 or the semiconductor substrate 100 due to the impurity-diffusion prevention layer 106. Movement of the impurities is indicated by the arrows that are provided in the figure.

In FIG. 2, the impurity-diffusion prevention layer 106 may be formed in the polysilicon layer 108. That is, the impurity-diffusion prevention layer 106 may be formed in a first polysilicon layer 108a and a second polysilicon layer 108b. Although not illustrated in FIG. 2, some embodiments provide that the impurity-diffusion prevention layer 106 may be non-uniformly formed by doping the first and second polysilicon layers 108a and 108b with diffusion-prevention impurities. Impurities included in the second polysilicon layer 108b do not diffuse into the insulating layer 104 or the semiconductor substrate 100 due to the impurity-diffusion prevention layer 106. Movement of the impurities is indicated by the arrows that are provided in the figure.

According to some embodiments, the electrical properties of the semiconductor device may not deteriorate by preventing impurities doped in the polysilicon layer 108 from diffusing to the outside during the manufacture of the semiconductor device, due to the impurity-diffusion prevention layer 106. In addition, impurities included in the polysilicon layer 108 may not diffuse into the semiconductor substrate 100 or the insulating layer 104. In this regard, voids and/or seams may not be generated in the polysilicon layer 108, thereby improving the contact properties of the semiconductor device.

Figure 3:
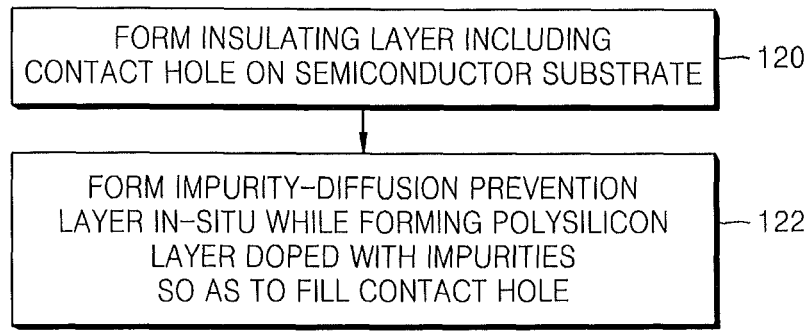
FIG. 3 is a flowchart for explaining methods of manufacturing the semiconductor device of FIG. 1, according to some embodiments of the present invention.

Reference is now made to FIG. 3, which is a flowchart for explaining methods of manufacturing the semiconductor device of FIG. 1, according to some embodiments of the present invention. Referring to FIGS. 1 and 3, the insulating layer 104 including the contact hole 102 may be formed on the semiconductor substrate 100, for example, a silicon substrate (operation 120). Some embodiments provide that the insulating layer 104, for example, a silicon oxide layer, is formed on the semiconductor substrate 100, and then the contact hole 102 is formed by patterning the insulating layer 104 by using a photolithography method.

In some embodiments, while the polysilicon layer 108 doped with impurities is being formed so as to fill and/or cover the contact hole 102, the impurity-diffusion prevention layer 106 may be formed in-situ (operation 122). That is, the polysilicon layer 108 filling and covering the contact hole 102 and doped with impurities may be formed in-situ by using a single manufacturing process. As described above, the impurity-diffusion prevention layer 106 may be non-uniformly formed by doping the polysilicon layer 108 with diffusion prevention impurities, for example, carbon, nitrogen and/or oxygen, among others.

The impurity-diffusion prevention layer 106 may be formed by depositing a precursor including diffusion prevention impurities, for example, carbon, nitrogen and/or oxygen in the contact hole 102 by using a chemical vapor deposition method. For example, if the diffusion prevention impurities are carbon, the impurity-diffusion prevention layer 106 may be formed by depositing a precursor including $SiH_3CH_3$ and $Si_2H_6$ (or $SiH_2Cl_2$), or a precursor including $SiH_4$ or $C_2H_4$ (or $SiH_3CH_3$). In embodiments that the diffusion prevention impurities are oxygen, the impurity-diffusion prevention layer 106 may be formed by depositing a precursor including $N_2O$ and $Si_2H_6$, or a precursor including $SiH_4$ and $N_2O$. In embodiments that the diffusion prevention impurities are nitrogen, the impurity-diffusion prevention layer 106 may be formed by depositing a precursor including $NH_3$ and $Si_2H_6$, or a precursor including $SiH_4$ and $NH_3$.

Figure 4:
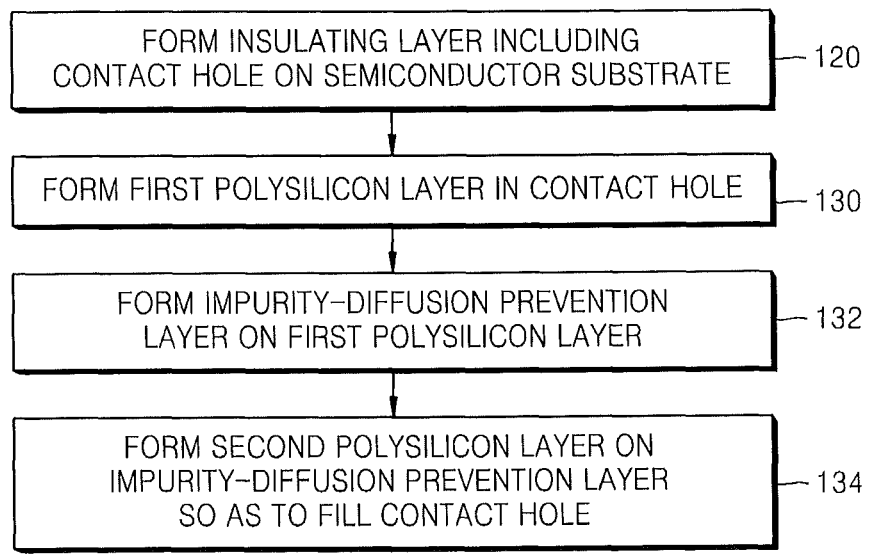
FIG. 4 is a flowchart for explaining methods of manufacturing the semiconductor device of FIG. 2, according to some embodiments of the present invention.

FIG. 4 is a flowchart for explaining methods of manufacturing the semiconductor device of FIG. 2, according to some embodiments of the present invention. Referring to FIGS. 2 and 4, the insulating layer 104 including the contact hole 102 may be formed on the semiconductor substrate 100, for example, a silicon substrate (operation 120). Some embodiments provide that the first polysilicon layer 108a doped with impurities is formed in the contact hole 102 (operation 130). In this regard, the first polysilicon layer 108a may also be formed above the insulating layer 104.

The impurity-diffusion prevention layer 106 may be formed on the first polysilicon layer 108a (operation 132). The impurity-diffusion prevention layer 106 formed on the first polysilicon layer 108a may be formed by depositing a precursor including diffusion prevention impurities, for example, carbon, nitrogen and/or oxygen in the contact hole 102 by using a chemical vapor deposition method, as described above with reference to FIG. 3.

Some embodiments provide that the impurity-diffusion prevention layer 106 formed on the first polysilicon layer 108a may be formed by growing a precursor including diffusion prevention impurities, for example, carbon, nitrogen and/or oxygen on the first polysilicon layer 108a by using an epitaxial growth method. In some embodiments, the impurity-diffusion prevention layer 106 formed on the first polysilicon layer 108a may be formed by growing an above-mentioned precursor on the first polysilicon layer 108a.

The impurity-diffusion prevention layer 106 formed on the first polysilicon layer 108a may be formed by injecting impurity ions including diffusion prevention impurities, for example, carbon, nitrogen and/or oxygen into the first polysilicon layer 108a and heating the resultant compound. The impurity-diffusion prevention layer 106 may be uniformly formed in the polysilicon layer 108, and/or may be non-uniformly formed by doping the impurity-diffusion prevention layer 106 with diffusion prevention impurities.

Some embodiments provide that the second polysilicon layer 108b filling and covering the contact hole 102 and doped with impurities is formed on the impurity-diffusion prevention layer 106 (operation 134). Thus, the manufacture of the polysilicon layer 108 including the impurity-diffusion prevention layer 106 may be performed.

Figure 5:
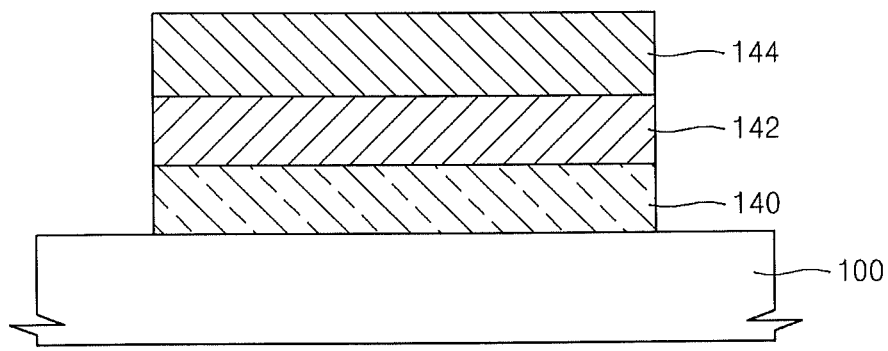
FIG. 5 is a cross-sectional view for testing diffusion degrees of impurities of first and second polysilicon layers and diffusion prevention impurities included in an impurity-diffusion prevention layer, in a semiconductor device according to some embodiments of the present invention.
Figure 6:
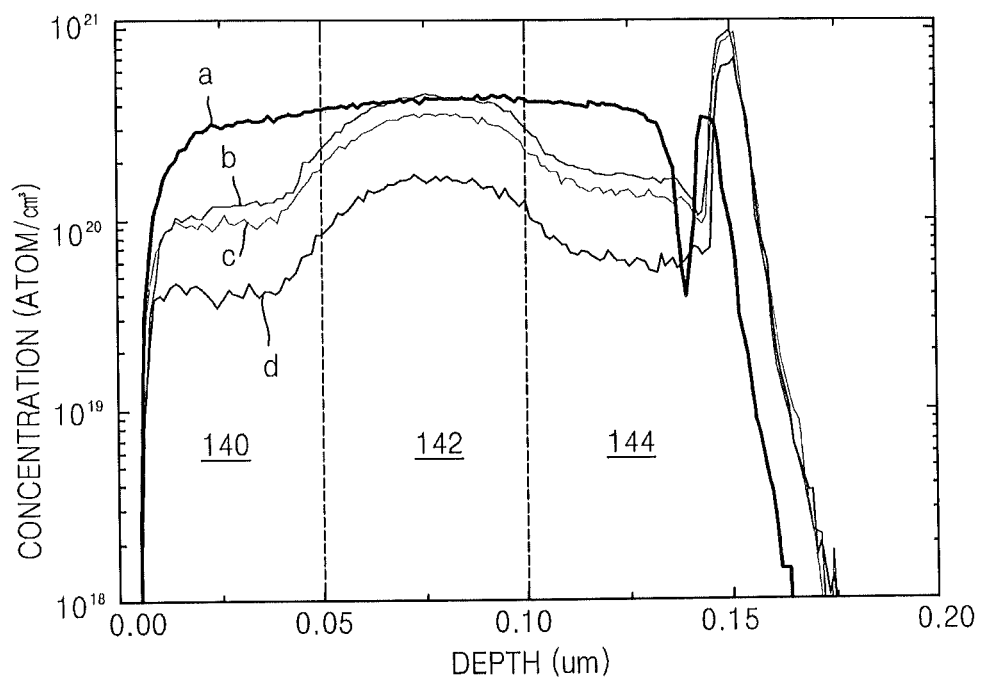
FIGS. 6 and 7 are graphs for explaining the depths of the impurities of the first and second polysilicon layers of FIG. 5 and the diffusion prevention impurities included in the impurity-diffusion prevention layer of FIG. 5, according to some embodiments of the present invention.
Figure 7:
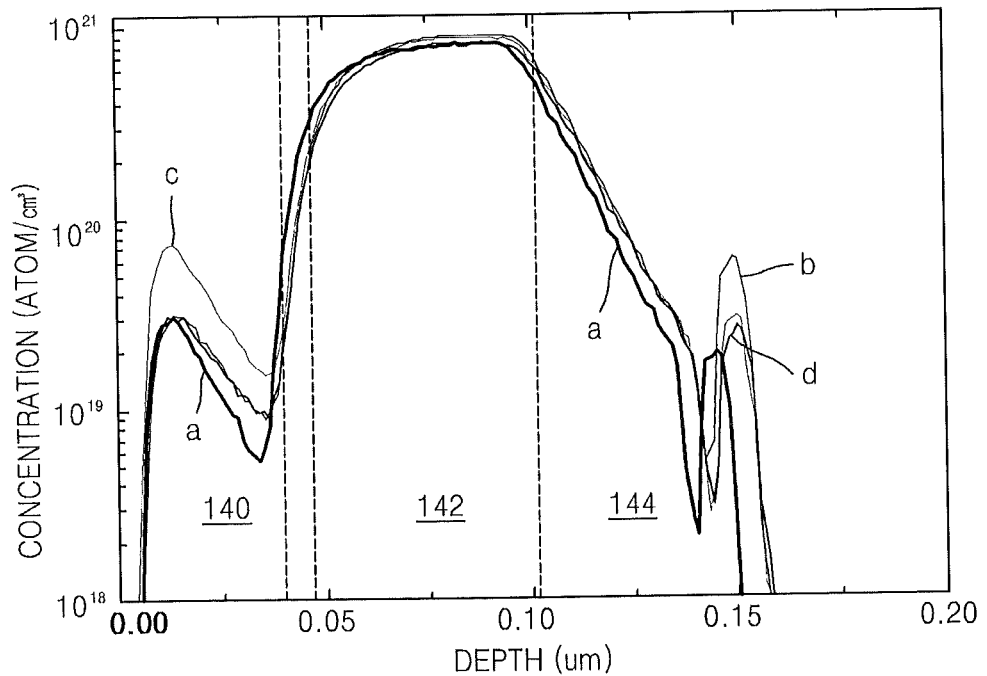

FIG. 5 is a cross-sectional view for testing diffusion degrees of impurities of first and second polysilicon layers 140 and 144 and diffusion prevention impurities included in an impurity-diffusion prevention layer 142, in a semiconductor device according to some embodiments of the present invention. FIGS. 6 and 7 are graphs for explaining the depths of the impurities of the first and second polysilicon layers 140 and 144 of FIG. 5 and the diffusion prevention impurities included in the impurity-diffusion prevention layer 142 of FIG. 5, according to some embodiments of the present invention.

Referring to FIG. 5, the first polysilicon layer 140 including impurities, for example, P, may be formed to a thickness of 500 Å on the semiconductor substrate 100, for example, a silicon substrate. The impurity-diffusion prevention layer 142 including diffusion prevention impurities, for example, carbon, may be formed to a thickness of 500 Å on the first polysilicon layer 140. The second polysilicon layer 144 including impurities, for example, P may be formed to a thickness of 500 Å on the impurity-diffusion prevention layer 142. By heating the semiconductor device according to embodiments as illustrated in FIG. 5, the diffusion degrees of the impurities of the first and second polysilicon layers 140 and 144 and the diffusion prevention impurities included in the impurity-diffusion prevention layer 142 may be tested.

FIG. 6 is a SIMS graph showing the diffusion degrees of the impurities, for example, P, of the first and second polysilicon layers 140 and 144. FIG. 7 is a SIMS graph showing the diffusion degrees of the impurities, for example, carbon, included in the impurity-diffusion prevention layer 142. Referring to FIGS. 6 and 7, 'a' indicates the case where heating is not performed, 'b', 'c' and 'd' indicate the cases where heating is performed at 850° C. and for 0.5 hours, at 850° C. and 1 hour, and at 850° C. and for 6 hours, respectively.

As shown in FIG. 6, the larger concentration of the impurities, for example, P, included in the first and second polysilicon layers 140 and 144 is prevented from diffusing in the first and second polysilicon layers 140 and 144, compared to in the impurity-diffusion prevention layer 142, in consideration of a heating temperature and time. That is, the impurities, for example, P, included in the first and second polysilicon layers 140 and 144 are more diffused in the first and second polysilicon layers 140 and 144 according to the heating temperature and time, and thus a larger concentration of the first and second polysilicon layers 140 and 144 is changed, compared to the impurity-diffusion prevention layer 142. In addition, the impurities included in the impurity-diffusion prevention layer 142 are less diffused in the impurity-diffusion prevention layer 142 according to the heating temperature and time, and thus a smaller concentration of the impurity-diffusion prevention layer 142 changed, as compared to the first and second polysilicon layers 140 and 144.

Referring to FIG. 7, the impurities, for example, carbon, included in the impurity-diffusion prevention layer 142 are barely diffused in consideration of a heating temperature and time. In particular, the impurities, for example, carbon, included in the impurity-diffusion prevention layer 142 are less diffused in the first and second polysilicon layers 140 and 144, according to the heating temperature and time, as compared to the impurity-diffusion prevention layer 142. In this regard, the concentration of the impurities, for example, carbon, of the impurity-diffusion prevention layer 142 are less changed, according to the heating temperature and time, as compared to the first and second polysilicon layers 140 and 144.

As a result, the impurities, for example, P, included in the first and second polysilicon layers 140 and 144 are less diffused in the impurity-diffusion prevention layer 142, according to the heating temperature and time, as compared to the first and second polysilicon layers 140 and 144. The impurities, for example, carbon, included in the impurity-diffusion prevention layer 142 are barely diffused in consideration of the heating temperature and time. Thus, the impurity-diffusion prevention layer 142 may prevent the impurities included in the first and second polysilicon layers 140 and 144 from diffusing.

Some embodiments of the present invention include a dynamic random access memory (DRAM) device using the semiconductor device according to the embodiments disclosed herein. Although a DRAM device is described, semiconductor devices disclosed herein may be used in other type of devices including memory devices and/or non-memory devices.

Figure 8:
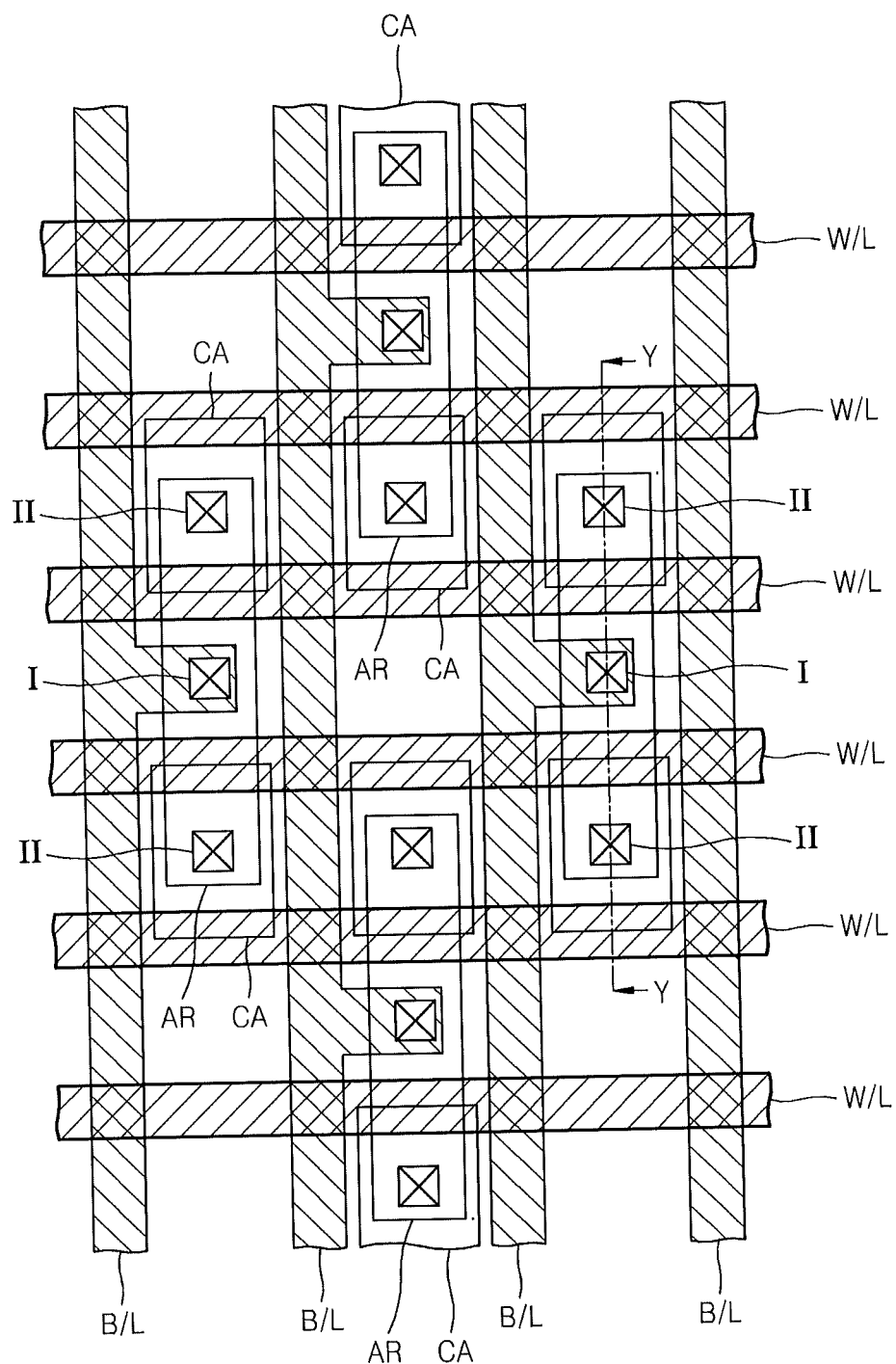
FIG. 8 is a layout diagram of a dynamic random access memory (DRAM) device according to some embodiments of the present invention.
Figure 9:
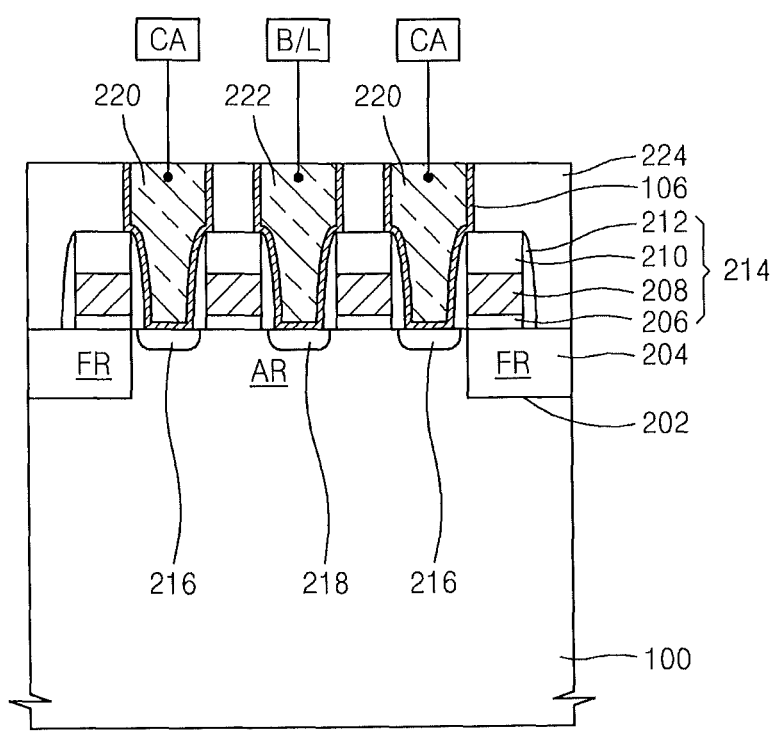
FIGS. 9 and 10 are cross-sectional views of the DRAM device taken along a line Y-Y of FIG. 8, according to some embodiments of the present invention.
Figure 10:
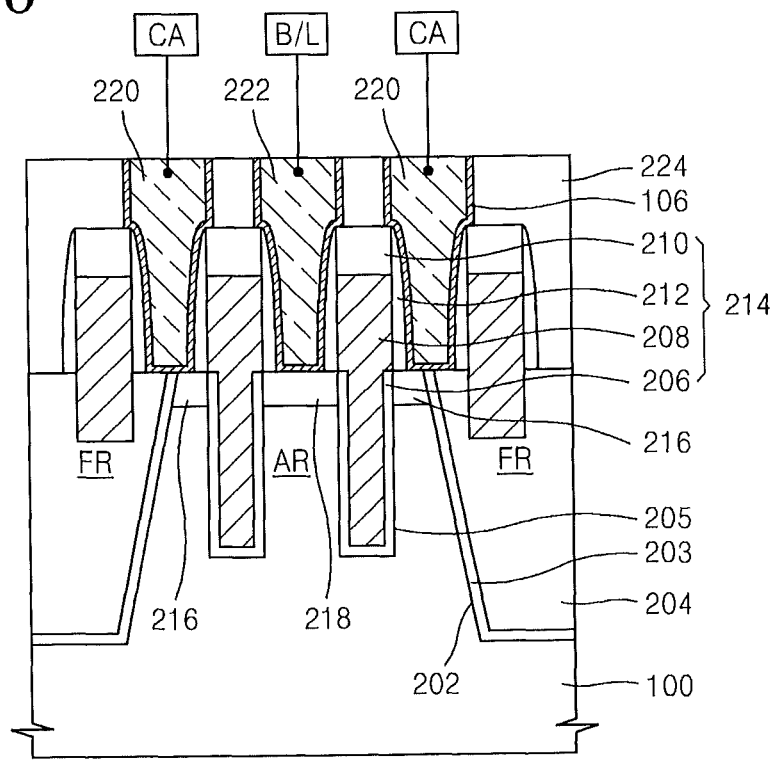

Reference is made to FIG. 8, which is a layout diagram of a DRAM device according to some embodiments of the present invention. Some embodiments provide that an active region AR is defined by an inactive area (a field region FR as shown in FIGS. 9 and 10), and two word lines W/L border the active region AR. Bit lines B/L may be formed on a different layer from a layer including the word lines W/L, and may be substantially perpendicularly aligned with respect to the word lines W/L. The word lines W/L may be arranged in a single direction and the bit lines B/L may be perpendicularly arranged to the word lines W/L.

A direct contact (DC) pad I connected to the bit lines B/L may be formed on a drain region that is formed on the active region AR. A buried contact (BC) pad II connected to a lower electrode may be formed on a source region that is formed on the active region AR. A capacitor CA, that is, the lower electrode of the DRAM device may be formed on the BC pad II.

Reference is now made to FIGS. 9 and 10, which are cross-sectional views of the DRAM device taken along a line Y-Y of FIG. 8, according to some embodiments of the present invention. Although FIGS. 9 and 10 show examples of the DRAM device, the present invention is not so limited. Some embodiments according to FIG. 9 provide that the DRAM device includes a planar channel array transistor. Some embodiments according to FIG. 10 shows the DRAM device includes a recess channel array transistor.

An active region (corresponding to the active region AR) defined by the inactive region FR may be formed on a semiconductor substrate 100, for example, a silicon substrate. The inactive region FR may be formed by filling an insulating material in a trench 202 formed by etching the semiconductor substrate 200. In FIG. 10, a liner layer 203, for example, a nitride layer, may be formed in the trench 202.

A plurality of gate stacks 214 functioning as the word lines W/L may be formed on the semiconductor substrate 100 where the active region AR is defined. Each of the gate stacks 214 may include a gate insulating layer 206, a gate electrode 208, a gate cap layer 210 and/or a gate spacer 212. As illustrated in FIG. 10, the gate insulating layer 206 may be formed on an inner wall of a recess channel trench 205 and the gate electrode 208 may fill the recess channel trench 205. The gate cap layer 210 may be formed on the gate electrode 208 and the gate spacer 212 may be formed on sidewalls of the gate electrode 208 and the gate cap layer 210. In this regard, the gate stacks 214 in FIG. 10 may be referred to as recess-type gate stacks.

The gate cap layer 210 may include a silicon nitride layer having a high selectivity with respect to a silicon oxide layer used as an interlayer dielectric. In some embodiments, in order to reduce gate resistance, a metal silicide (not shown) may be further formed between the gate electrode 208 and the gate cap layer 210. The gate spacer 212 may include a silicon nitride layer having a high selectivity with respect to a silicon oxide layer used as an interlayer dielectric.

Impurity regions 216 and 218, that is, a source region 216 and a drain region 218, may be formed below both sidewalls of the gate stacks 214. The impurity regions 216 and 218 may be formed in a portion of the semiconductor substrate 100 corresponding to a space between the gate stacks 214.

Contact pads 220 and 222 may be formed on the semiconductor substrate 100 between the gate spacers 212. The contact pads 220 and 222 may be formed on the impurity regions 216 and 218 between the gate stacks 214. The contact pads 220 and 222 may be insulated from each other by an interlayer dielectric 224. The interlayer dielectric 224 may include a silicon oxide layer.

The contact pads 220 and 222 include a polysilicon layer doped with impurities and may include an impurity-diffusion prevention layer 106. The contact pads 220 and 222 may include a direct contact (DC) pad 222 and a buried contact (BC) pad 220, as described above. Some embodiments provide that the DC pad 222 and the BC pad 220 are connected to the bit lines B/L and the capacitor CA, respectively. In FIGS. 9 and 10, like in FIG. 1, the impurity-diffusion prevention layers 106 are formed on the impurity regions 216 and 218, at an interface between each of the DC pad 222 and the BC pad 220 and the gate stacks 214, and/or at an interface between each of the DC pad 222 and the BC pad 220 and the interlayer dielectric 224. Of course, like in FIG. 2, the impurity-diffusion prevention layers 106 may be formed in the DC pad 222 and the BC pad 220.

In this regard, the impurities included in the DC pad 222 and the BC pad 220 do not diffuse into the impurity regions 216 and 218, that is, the source region 216 and the drain region 218, due to the impurity-diffusion prevention layer 106. In this manner, the electrical properties of the DRAM device may be improved. In addition, the impurities included in the contact pads 220 and 222 do not diffuse into the semiconductor substrate 100 or the gate stacks 214. Accordingly, voids and/or seams may not be generated in the contact pads 220 and 222 and thus the contact properties of the DRAM device may be improved.

Figure 11:
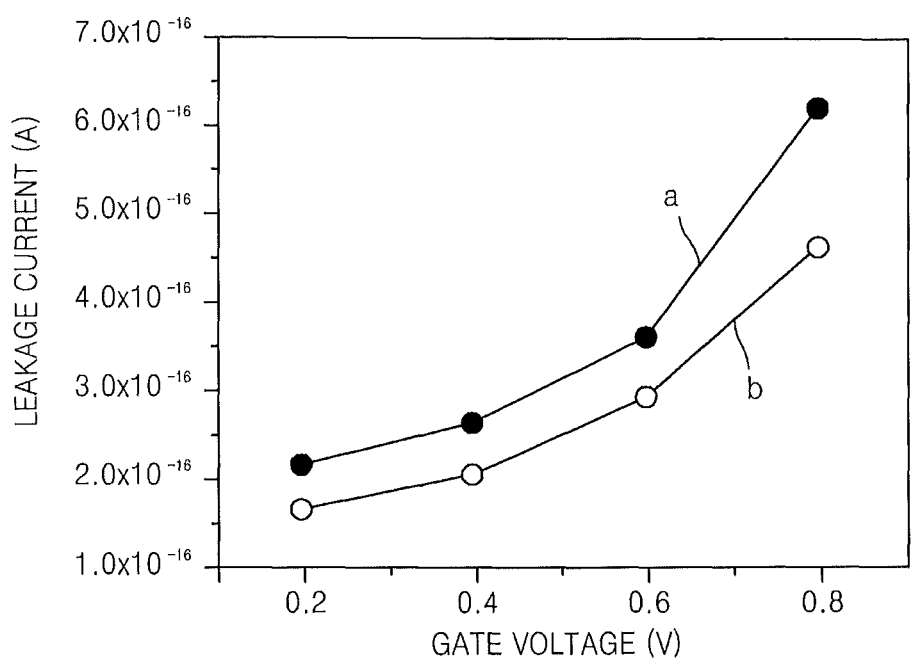
FIGS. 11 and 12 are graphs showing leakage and refresh properties of a DRAM device according to some embodiments of the present invention.
Figure 12:
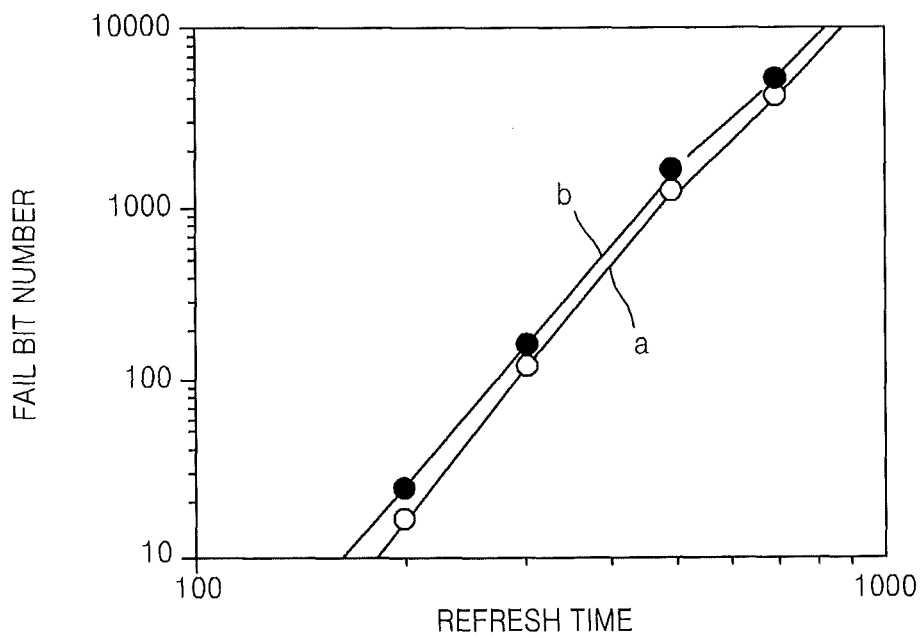

Reference is now made to FIGS. 11 and 12, which are graphs showing leakage and refresh properties of a DRAM device according to some embodiments of the present invention. As illustrated, the 'a' indicates the case where a contact pad includes only a polysilicon layer doped with impurities and 'b' indicates the case where a contact pad includes a polysilicon layer doped with impurities and including an impurity-diffusion prevention layer.

As shown in FIG. 11, it may be seen that a leakage current of the DRAM device according to embodiments herein is lower at a predetermined gate voltage than in the conventional DRAM device. In addition, as illustrated in FIG. 12, it may be seen that a refresh time of the DRAM device according to embodiments herein is lower at a predetermined fail bit number than in the conventional DRAM device.

Hereinafter, various application examples using a DRAM device according to some embodiments of the present invention will be described. A DRAM chip may be formed by packaging the DRAM device. Although there are various application examples of the DRAM chip, several application examples will be described.

Figure 13:
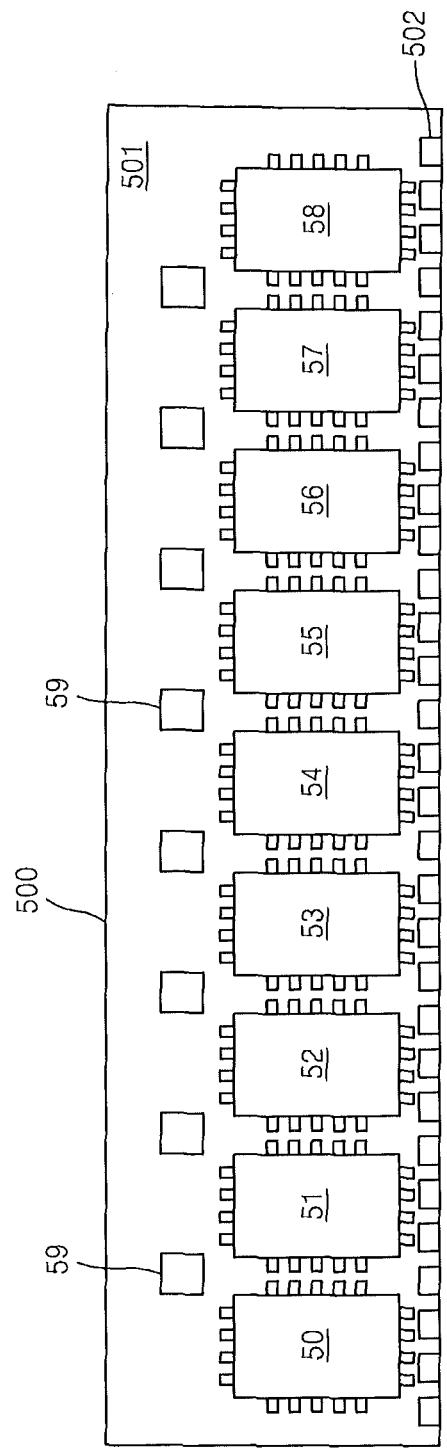
FIG. 13 is a plan view of a memory module including DRAM chips, according to some embodiments of the present invention.

Reference is now made to FIG. 13, which is a plan view of a memory module 500 including DRAM chips 50 to 58, according to some embodiments of the present invention. The DRAM chips 50 to 58 may be formed by packaging integrated circuit (IC) semiconductor devices according to some embodiments of the present invention. The DRAM chips 50 to 58 may be used in the memory module 500. The memory module 500 may be formed by attaching the DRAM chips 50 to 58 to a module substrate 501. The memory module 500 may include a connector 502 that may be inserted into a socket of a mother board. The connector 502 may be disposed at one side of the module substrate 501. A ceramic decoupling capacitor 59 may be formed on the module substrate 501. The embodiments of the memory module 500 are not limited to the structure illustrated in FIG. 13, and may have various other structures.

Figure 14:
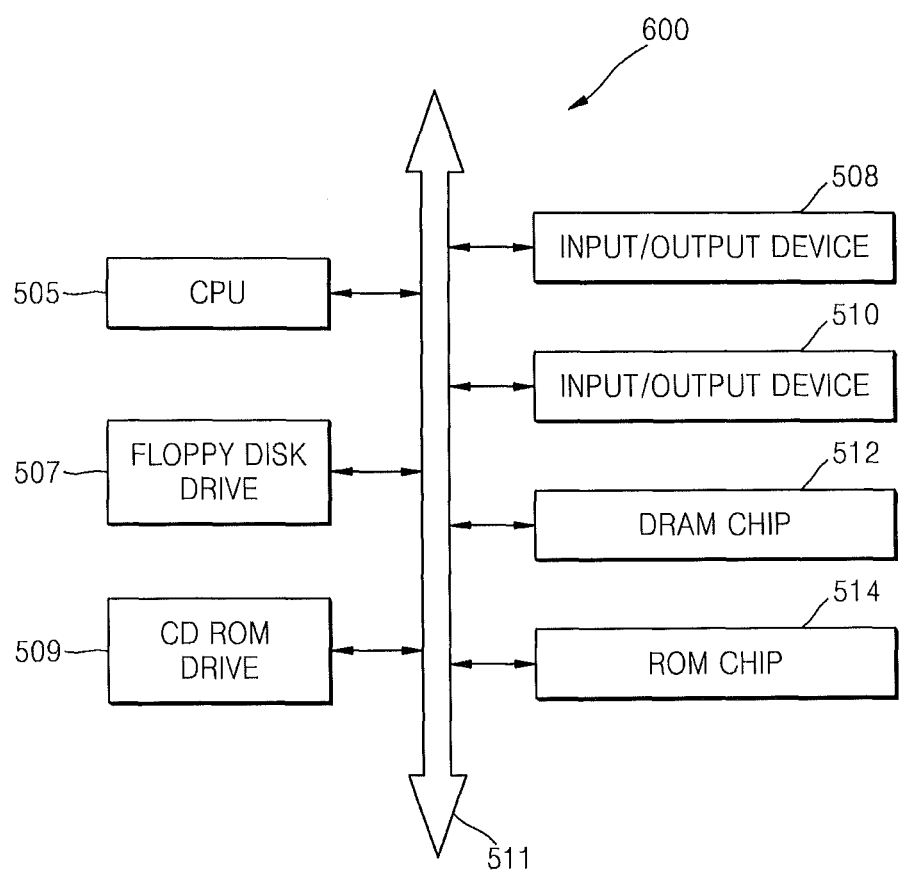
FIG. 14 is a block diagram of an electronic system including a DRAM device, according to some embodiments of the present invention.

Reference is now made to FIG. 14, which is a block diagram of an electronic system 600 including a DRAM device according to some embodiments of the present invention. In some embodiments, the electronic system 600 refers to a computer, however, the electronic system is not so limited. The electronic system 600 may include a peripheral device such as a central processing unit (CPU) 505, a floppy disk drive 507, a CD read only memory (ROM) drive 509, input/output devices 508 and 510, a DRAM chip 512, and/or a ROM chip 514, among others. Control signals and data may be transferred between these elements by using a communication channel 511. Some embodiments provide that the DRAM chip 512 may be replaced with the memory module 500 illustrated in FIG. 13.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the embodiments disclosed herein, and that modifications to the disclosed embodiments, as well as other embodiments, are intended to be included within the scope of the appended claims. The present invention is defined by the following claims.

What is claimed is:

1. A semiconductor device comprising:
a semiconductor substrate;
an insulating layer that includes a contact hole through which the semiconductor substrate is exposed; and
a polysilicon layer that is configured to fill and cover the contact hole, the polysilicon layer comprising:
a first polysilicon layer formed in the contact hole and that is doped with impurities;
an impurity-diffusion prevention layer that is formed on the first polysilicon layer in the contact hole; and
a second polysilicon layer that is formed on the impurity-diffusion layer, that is doped with impurities and that is configured to fill and cover the contact hole,
wherein the impurity-diffusion prevention layer is configured to prevent impurities included in the second polysilicon layer from diffusing into the insulating layer and into the semiconductor substrate, and
wherein the impurity diffusion prevention layer comprises at least one diffusion-prevention impurity material selected from a group including carbon and oxygen.

2. A semiconductor device comprising:
a plurality of gate stacks formed on a semiconductor substrate;
a impurity region formed in the semiconductor substrate between the plurality of gate stacks; and
a pad polysilicon layer formed on the impurity region between the plurality of gate stacks, wherein the pad polysilicon layer is doped with impurities and comprises an impurity-diffusion prevention layer that is configured to prevent the diffusion of the impurities in the pad polysilicon layer into the impurity region, the semiconductor substrate or the plurality of gate stacks,
wherein the impurity-diffusion prevention layer is formed in the pad polysilicon layer or at an interface between each of the gate stacks and the pad polysilicon layer,
wherein each of the plurality of gate stacks comprises a gate insulating layer, a gate electrode, a gate cap layer and a gate spacer, and wherein the impurity-diffusion prevention layer comprises at least one diffusion-prevention impurity material selected from a group including carbon and oxygen.

3. The semiconductor device of claim 2, wherein the gate insulating layer is formed in a recess channel trench formed by etching the semiconductor substrate, and
wherein the gate electrode is formed on a portion of the gate insulating layer, which is formed in the recess channel trench, and the semiconductor device.

4. The semiconductor device of claim 2, wherein the impurity-diffusion prevention layer is formed in the pad polysilicon layer, at an interface between the impurity region and the pad polysilicon layer.

5. A dynamic random access memory (DRAM) semiconductor device comprising:
a plurality of gate stacks formed on a semiconductor substrate, and functioning as word lines;
an impurity region formed in the semiconductor substrate between the gate stacks;
a direct contact (DC) pad and a buried contact (BC) pad that are formed on the impurity region between the gate stacks, wherein each of the DC pad and the BC pad comprises a polysilicon layer that is doped with impurities and wherein the polysilicon layer comprises an impurity-diffusion prevention layer that is configured to prevent diffusion of the impurities in the DC pad and the BC pad into the impurity region; and
a bit line and a capacitor connected to the DC pad and the BC pad, respectively,
wherein the impurity-diffusion prevention layer is formed in the DC pad and the BC pad, or at an interface between the gate stack and each of the DC pad and the BC pad, and
wherein the impurity-diffusion prevention layer comprises at least one diffusion-prevention impurity material selected from a group including carbon and oxygen.

6. The DRAM semiconductor device of claim 5, wherein the impurity-diffusion prevention layer is formed in the DC pad and the BC pad, at an interface between the impurity region and each of the DC pad and the BC pad.

* * * * *